(12) United States Patent
Chang et al.

(10) Patent No.: US 8,618,636 B1
(45) Date of Patent: Dec. 31, 2013

(54) FIN BIPOLAR TRANSISTORS HAVING SELF-ALIGNED COLLECTOR AND EMITTER REGIONS

(75) Inventors: Josephine B Chang, Yorktown Heights, NY (US); Gen Pei Lauer, Yorktown Heights, NY (US); Isaac Lauer, Yorktown Heights, NY (US); Jeffrey W Sleight, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/609,615

(22) Filed: Sep. 11, 2012

Related U.S. Application Data

(63) Continuation of application No. 13/607,877, filed on Sep. 10, 2012.

(51) Int. Cl.
*H01L 29/66* (2006.01)

(52) U.S. Cl.
USPC ......................................................... 257/565

(58) Field of Classification Search
None
See application file for complete search history.

(56) References Cited

U.S. PATENT DOCUMENTS

| | | | |
|---|---|---|---|
| 6,630,377 B1 | 10/2003 | Panday et al. | |
| 6,858,478 B2 * | 2/2005 | Chau et al. | 438/149 |
| 6,861,325 B1 | 3/2005 | Pan et al. | |
| 7,173,320 B1 | 2/2007 | Rahim | |
| 7,476,942 B2 | 1/2009 | Watanabe et al. | |
| 7,700,449 B2 * | 4/2010 | Lee | 438/299 |
| 7,834,403 B2 | 11/2010 | Kakosche et al. | |
| 7,985,959 B2 * | 7/2011 | Magistretti et al. | 257/2 |
| 8,053,839 B2 | 11/2011 | Yeo et al. | |
| 8,367,498 B2 * | 2/2013 | Chang et al. | 438/268 |
| 2006/0060941 A1 | 3/2006 | Sun et al. | |
| 2007/0132053 A1 * | 6/2007 | King et al. | 257/499 |
| 2010/0052059 A1 * | 3/2010 | Lee | 257/368 |
| 2010/0148276 A1 | 6/2010 | Uhlig et al. | |
| 2010/0176424 A1 | 7/2010 | Yeo et al. | |
| 2010/0320572 A1 | 12/2010 | Chung et al. | |
| 2012/0049282 A1 * | 3/2012 | Chen et al. | 257/347 |

OTHER PUBLICATIONS

Moon, et al., Fin-Width Dependence of BJT-Based 1T-DRAM Implemented on FinFET. IEEE Electron Device Letters, vol. 31, No. 9. Sep. 2010.

* cited by examiner

*Primary Examiner* — Scott B Geyer
(74) *Attorney, Agent, or Firm* — Vazken Alexanian

(57) ABSTRACT

A method for fabricating a bipolar transistor device. The method includes the steps of: providing a SOI substrate having a silicon layer thereon; patterning lithographically a fin hardmask on the silicon layer; placing a dummy contact line over a central portion of patterned fin hardmask; doping the collector/emitter regions; depositing a filler layer over the collector region and the emitter region; removing the dummy contact line to reveal a trench and the central portion of the patterned fin hardmask; forming fin-shaped base regions by removing, within the trench, a portion of the silicon layer not covered by the central portion of the patterned fin hardmask after the step of removing the dummy contact line; doping the fin-shaped base region; and forming a contact line by filling the trench with a contact line material over the fin-shaped base regions, where the collector/emitter regions are self-aligned with the contact line.

18 Claims, 22 Drawing Sheets

FIN BIPOLAR TRANSISTORS HAVING SELF-ALIGNED COLLECTOR AND EMITTER REGIONS

CROSS-REFERENCE TO RELATED APPLICATION

This application is a continuation of and claims priority from U.S. patent application Ser. No. 13/607,877, filed Sep. 10, 2012, the entire contents of which are incorporated herein by reference.

BACKGROUND OF THE INVENTION

1. Field of the Invention

The present invention relates to integrated circuits. More particularly, the present invention relates to bipolar transistor devices and methods for the fabrication thereof.

2. Description of Related Art

Due to their fast switching times and high current densities, field effect transistor (FET) devices are generally preferred as semiconductor device architecture in today's technology. Despite the prevalence of FETs, however, bipolar transistors have superior device attributes in some areas, especially for analogue and power gain applications. For example, bipolar transistor devices have higher speed, higher current density, lower noise and higher cutoff frequency than conventional FET devices. A typical drawback of bipolar devices, having high static power dissipation, becomes less relevant when circuits of FET devices increase their operating speed. When that happens, FET devices also create high static power dissipation.

Conventional bipolar devices, however, require: (1) abrupt emitter to base junctions and; (2) well controlled base region lengths. Because of these requirements, conventional bipolar devices are typically not scaled for density.

To reduce the size of semiconductor devices, it has been known that vertical bipolar transistors have been utilized, especially when the bipolar transistors are integrated with FET devices in a single chip. It has been further known that finned bipolar transistors, which incorporate fin forming techniques previously used to form fin bipolar transistor devices, have been used for semiconductor devices. This architecture allows scaled finned bipolar devices to be formed on a single chip substrate.

As feature sizes of the devices get increasingly smaller (commensurate with current technology), however, accurately and consistently contacting the collector and emitter regions with the contact line becomes a major problem. In some instances, collector and emitter regions are used to contact the fins instead in order to provide mechanical stability during processing, which simplifies the device contacting scheme and reduces external resistance. However, the regions still need to be precisely aligned with the contact line in order to achieve a practical contact line pitch (in the case of logic layouts using minimum contact line pitch) and to minimize variations in extrinsic resistance and parasitic capacitance. Thus, properly and consistently aligning the collector and emitter regions with the contact line is difficult.

Accordingly, bipolar transistor devices and methods for fabrication thereof that improve the device contacting scheme and scalability of the devices can be desirable.

SUMMARY OF THE INVENTION

Accordingly, one aspect of the present invention provides a method for fabricating a bipolar transistor device, the method including the steps of: providing a silicon-on-insulator (SOI) substrate having a silicon layer thereon; patterning lithographically a fin hardmask on the silicon layer; placing a dummy contact line over a central portion of patterned fin hardmask, where the step of placing exposes a collector region and an emitter region; doping the collector region and the emitter region; depositing a filler layer over the collector region and the emitter region; removing the dummy contact line to reveal a trench and the central portion of the patterned fin hardmask; forming a plurality of fin-shaped base regions in the silicon layer by removing, within the trench, a portion of the silicon layer not covered by the central portion of the patterned fin hardmask after the step of removing the dummy contact line; doping the fin-shaped base region; and forming a contact line by filling the trench with a contact line material over the fin-shaped base regions, where the collector and emitter regions are self-aligned with the contact line.

Another aspect of the present invention provides a bipolar transistor device, including: a collector region; an emitter region; a plurality of fin-shaped base regions connecting the collector region and the emitter region; and a contact line placed over at least a portion of the fins, where the collector region and the emitter region are self aligned with the contact line.

DETAILED DESCRIPTION OF THE PREFERRED EMBODIMENTS

The above and other features of the present invention will become more distinct by a detailed description of embodiments shown in combination with attached drawings. Identical reference numbers represent the same or similar parts in the attached drawings of the invention.

Figure 1:
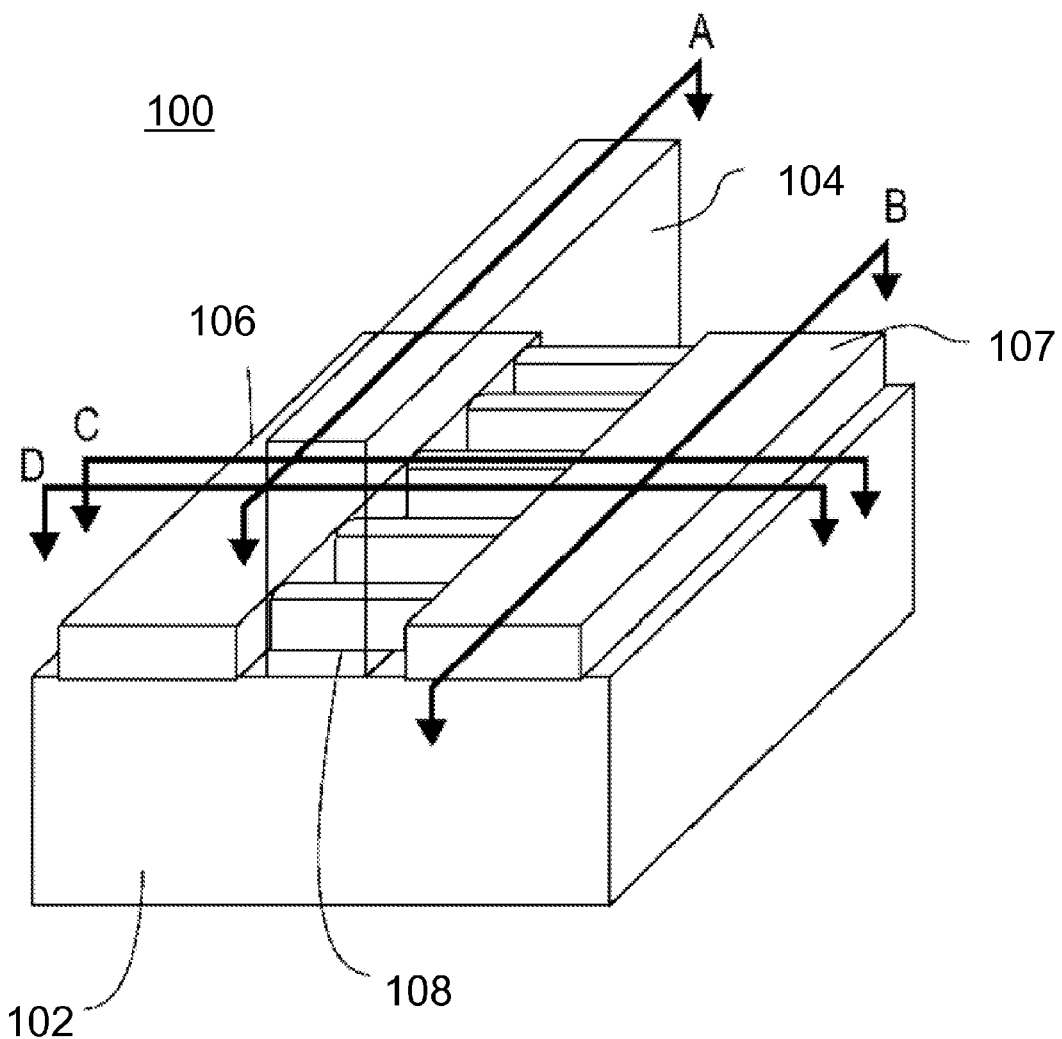
FIG. 1 illustrates a fin bipolar transistor device with self-aligned collector/emitter regions according to an embodiment of the present invention.

FIG. 1 is a diagram illustrating exemplary fin bipolar transistor device 100. The device 100 includes substrate 102, contact line stack 104, collector/emitter region 106, collector/emitter region 107 and fin-shaped base regions (channels) 108 between collector/emitter region 106 and collector/emitter region 107. The bipolar transistor device 100 is fabricated, for example, according to the flowchart described in FIG. 4, described in conjunction with the description of FIG. 6. Therefore, collector/emitter regions 606 and 107 are self-aligned with contact line stack 104. Cross-sectional views of the bipolar transistor device 100 through planes A-D, are shown in FIGS. 2A-D, respectively.

The fin bipolar transistor devices show competitive contact line pitch and fin pitch, in comparison to CMOS technology today. The general practice in the microelectronics industry has been to use a contact line pitch of about 250 nm for a 65 nm technology node and about 190 nm for a 45 nm technology node, with a shrink of between about 70% and about 80% for each subsequent node. Thus, for bipolar transistor devices to be used in a node beyond the 45 nm technology node, a competitive contact line pitch can be one that is at most 190 nm.

Fin pitch needs to be at most twice the fin height to achieve equivalency to planar layout density. As described above, a fin pitch of between about 40 nm and about 200 nm, e.g., between about 40 nm and about 80 nm, and a fin height of between about 20 nm and about 100 nm, e.g., about 25 nm, are achievable using the present techniques.

In instances where multiple bipolar transistor and FET devices are placed next to each other on the same wafer (FIG. 3) and/or where a number of contact line "fingers" control multiple bipolar transistor and FET devices on the same wafer, contact line pitch, i.e., distance between contact lines on adjacent devices, has to be compatible with the current technology node at the time of insertion. In the embodiment of the present invention, a contact line pitch of below 200 nm, e.g., between about 180 nm and about 200 nm, is achievable using the present techniques.

Figure 2C:
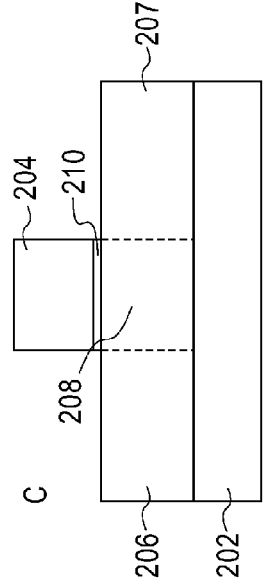
FIG. 2A to 2D are diagrams illustrating different cross-sectional views of the fin bipolar device of FIG. 1 according to an embodiment of the present invention.
Figure 2D:
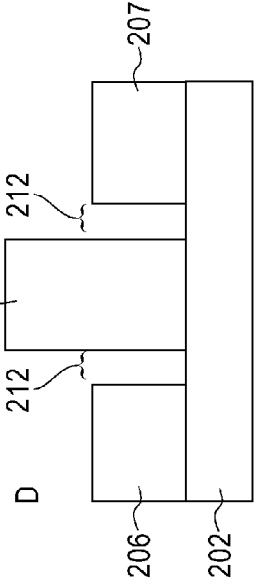
Figure 2A:
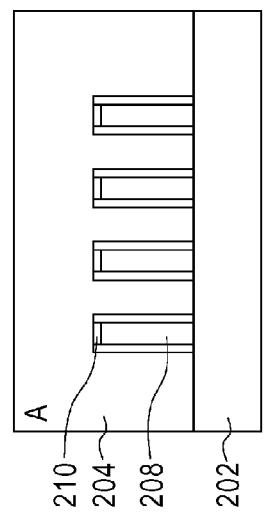

FIG. 2A to FIG. 2D are diagrams illustrating different cross-sectional views of fin bipolar transistor device 100, described, for example, in conjunction with the description of FIG. 2, above. Namely, FIG. 2A is a diagram illustrating a cross-sectional view of fin bipolar transistor device 200 through plane A, which bisects each of the four fins. As shown in FIG. 2A, a contact line dielectric 210 is present between contact line 204 and fin-shaped base regions 208.

Figure 2B:
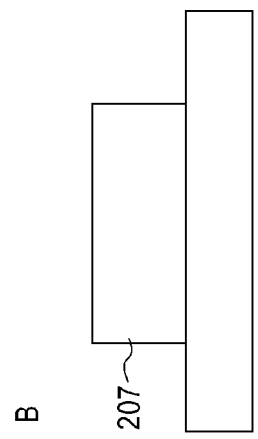

FIG. 2B is a diagram illustrating a cross-sectional view of fin bipolar transistor device 200 through plane B, which bisects collector/emitter region 207. FIG. 2C is a diagram illustrating a cross-sectional view of fin bipolar transistor device 200 through plane C, which bisects contact line stack 204 and fins 208/collector/emitter regions 206 and 207. As shown in FIG. 2C, contact line dielectric 210 is present between contact line stack 204 and fins 208. For illustrative purposes only, dotted lines are used to distinguish fins 208 from collector/emitter regions 206 and 207 and to show that, as described above, fins 208 are patterned only beneath contact 204. However, it is to be understood that fins 208 and collector/emitter regions 206 and 207 form one contiguous structure.

FIG. 2D is a diagram illustrating a cross-sectional view of fin bipolar transistor device 200 through plane D, which bisects contact line stack 204 and collector/emitter regions 206 and 207. As shown in FIG. 2D, gaps 212 are present between contact line stack 204 and collector/emitter regions 206 and 207. As described above, these gaps can optionally be filled with a device spacer. Further, as will be described in conjunction with the description of FIG. 3, below, the device spacer and the contact line dielectric 210 can be configured to achieve a desired differential fringe capacitance in the device.

Figure 3:
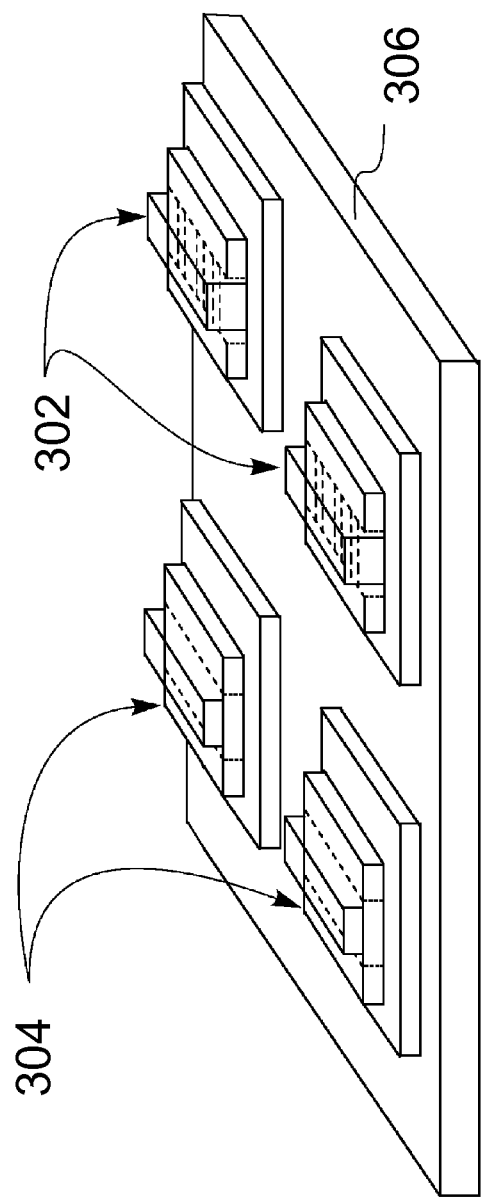
FIG. 3 illustrates fin bipolar devices and planar FET devices integrated on a single chip according to an embodiment of the present invention.

FIG. 3 is a diagram illustrating fin bipolar transistor devices 302 and planar field effect transistor (FET) devices 304 integrated on a single chip., i.e., chip 306. Chip 306 is an example of hybrid CMOS technology.

Like fin bipolar transistor device 100 described, for example, in conjunction with the description of FIG. 6 below, each of fin bipolar transistor devices 302 includes a substrate, a contact line stack, collector/emitter regions and fins between the collector/emitter regions. Each of planar FET devices 304 includes collector/emitter regions with a channel in between and a gate stack separated from the channel by a contact line oxide layer. The structure of a typical planar FET device is well known to those of ordinary skill in the art, and is not described further herein.

The present fin bipolar transistor fabrication process, which will be described in FIG. 6 hereinbelow, readily permits the instant fin bipolar transistor devices to be fabricated along with planar FET devices on the same wafer. Namely, as will be described in detail below, contact line patterning, contact line dielectric formation and contact line formation of the fin bipolar transistor devices and gate stack formation of the planar FET devices can occur at the same time.

Such a hybrid configuration is advantageous, for example, because it is much easier to make certain devices, such as analog FET devices, power devices and FET devices with different threshold voltages in planar FET devices. Traditional fin bipolar transistor fabrication processes are very difficult to integrate with planar FET devices. For example, with fin bipolar transistor devices, a hardmask is needed to protect the fins during RIE of the contact line and/or spacers. However, with planar FET devices, the contact line oxide layer is needed on top of the channel. Using traditional fabrication processes, the hardmask can have to be deposited on the fins and then separately removed from each planar FET device to deposit the contact line oxide layer. This process is time consuming and impractical. With the present techniques, however, the contact line is placed after RIE of the spacers, which means that there is a hardmask in place during spacer RIE, which is then removed before putting on the contact line (see description of FIG. 6, above). Thus, it is easier to deposit the contact line oxide layer on the planar FET devices located on the same chip.

Further, with regard to fin bipolar transistor devices, a taller contact line is required (as compared to a planar FET device) to cover a topology of the fin-shaped base regions. Subsequent CMP is in most instances then needed to planarize the top of the contact line. If epitaxial silicon growth is used to extend the collector/emitter regions, then a hardmask is needed over the contact line to prevent epitaxial silicon from contacting the contact line. RIE of the contact line needs to clear fin sidewalls instead of just stopping as soon as it hits silicon. None of these processes are needed for planar FET devices. With the present techniques, however, the use of the dummy contact line (see description of FIG. 6) eliminates topology differences between the fin bipolar transistor and the planar FET devices (the contact line is the same for both), making integration of the two process technologies easier.

Also, with regard to fin bipolar transistor devices, forming spacers can be a very complicated process, i.e., requiring a long over etch to clear the fin sidewalls. As a result, it is generally not feasible to make multiple spacers. With planar FET devices, by contrast, multiple spacers are often used.

With the present techniques, however, fins are made only under the contact line (see description of FIG. 6). Once the fins are covered with the contact line the device looks the same as a planar FET device and can be processed the same as a planar FET device, such as to add spacers.

Figure 4:
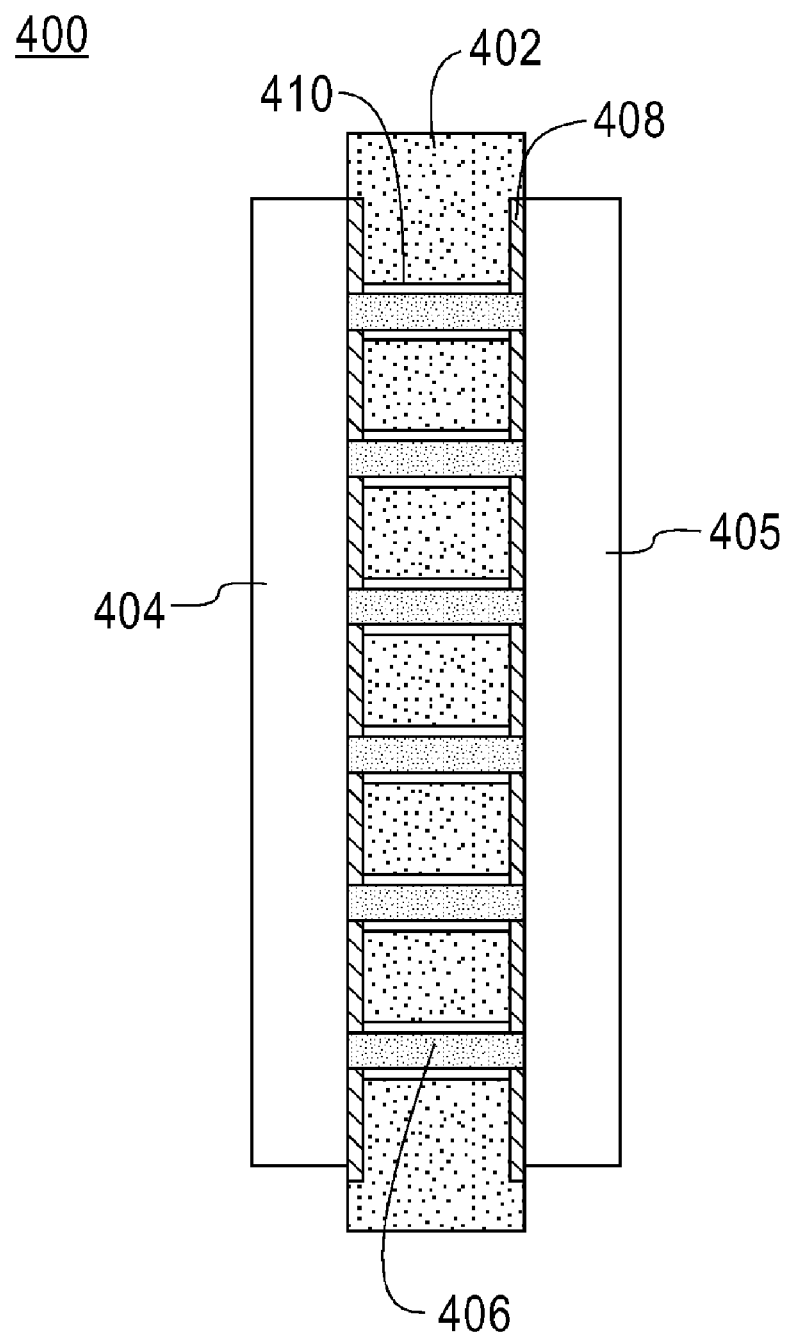
FIG. 4 illustrates a top-down view of the finned bipolar device showing fringe and gate capacitance according to an embodiment of the present invention.

FIG. 4 is a diagram illustrating a top-down view of exemplary fin bipolar transistor device 400 showing fringe capacitance. For ease of depiction, only those components necessary for illustrating the fringe capacitance in the device are shown. fin bipolar transistor device 400 includes contact line stack 402, collector/emitter region 404, collector/emitter region 405 and fins 406 between collector/emitter regions 404 and 405.

The three-dimensional nature of the fin bipolar transistor device introduces parasitic fringe capacitance between the contact line and sidewalls of the collector/emitter regions (i.e., along sections 408). This fringe capacitance should be kept to a small value much smaller than, e.g., less than half, the gate capacitance.

This differential capacitance can be achieved in a number of ways. By way of example only, a spacer can be formed only along regions 408 but not on regions 410. This approach was described in conjunction with the description of step 118 of FIG. 1, above. Differential dielectric growth, in which growth of a dielectric is expedited along the parasitic surfaces, i.e., along sections 408, when compared to the channel surfaces, i.e., along sections 410, during contact line dielectric growth, is another way to achieve differential capacitance. Differential dielectric growth can be achieved by taking advantage of the differential oxidation rates of different crystallographic planes and/or by modifying only the parasitic surfaces (collector/emitter region sidewall surfaces) through tilted implants.

Figure 5:
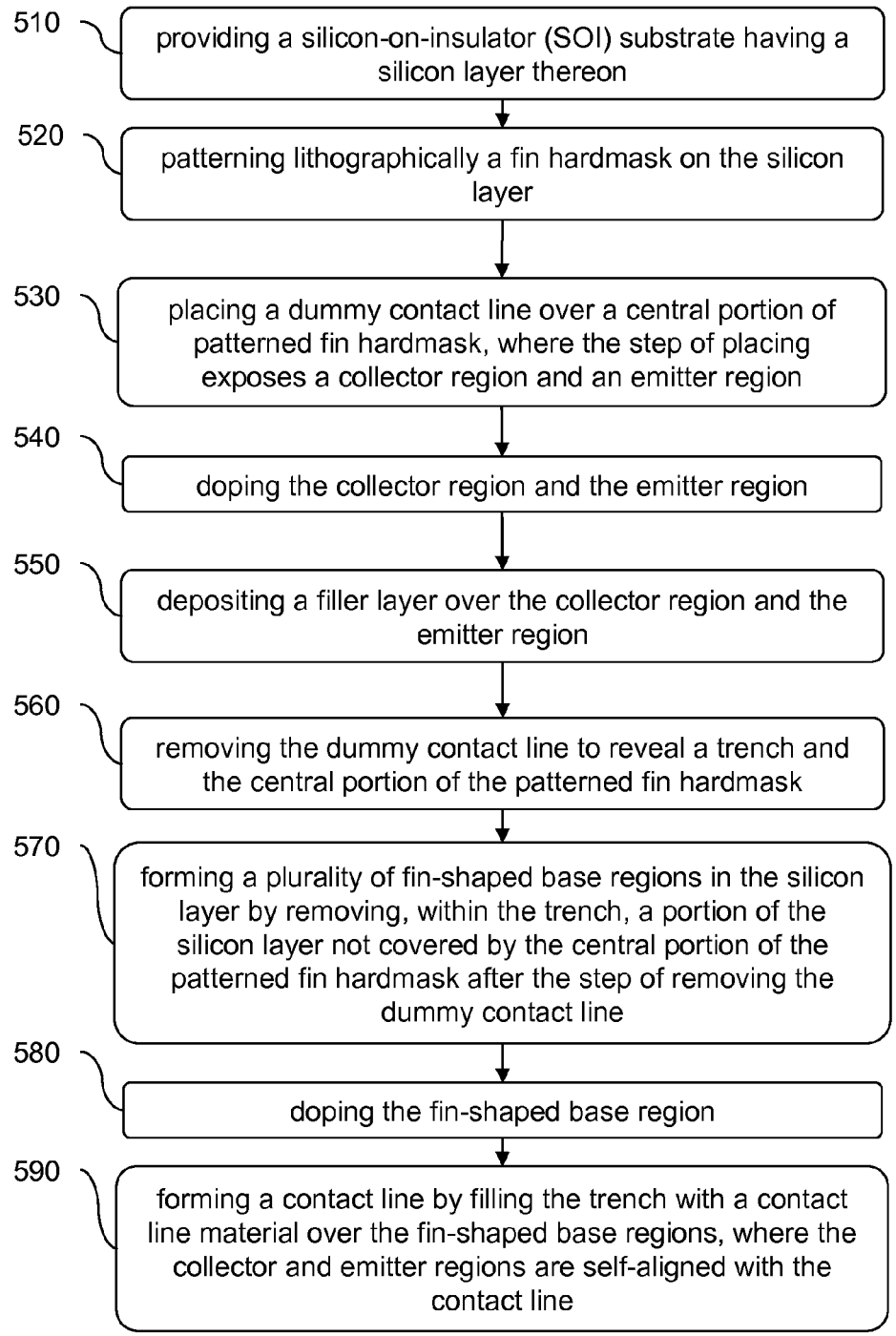
FIG. 5 illustrates a flowchart of a method fabricating a fin bipolar transistor device according to an embodiment of the present invention.

FIG. 5 illustrates a flowchart of an overall method fabricating a fin bipolar transistor device according to an embodiment of the present invention. The process, in general, includes the steps of: providing a silicon-on-insulator (SOI) substrate having a silicon layer thereon (Step 510); patterning lithographically a fin hardmask on the silicon layer (Step 520); placing a dummy contact line over a central portion of patterned fin hardmask, where the step of placing exposes a collector/emitter region (Step 530); doping the collector/emitter region (Step 540); depositing a filler layer over the collector/emitter region (Step 550); removing the dummy contact line to reveal a trench and the central portion of the patterned fin hardmask (Step 560); forming a plurality of fin-shaped base regions in the silicon layer by removing, within the trench, a portion of the silicon layer not covered by the central portion of the patterned fin hardmask after the step of removing the dummy contact line (Step 570); doping the fin-shaped base region (Step 580); and forming a contact line by filling the trench with a contact line material over the fin-shaped base regions, where the collector and emitter regions are self-aligned with the contact line (Step 590). The details of each step under FIG. 5 will be further described hereinbelow in accordance with FIGS. 6A to 6L.

FIGS. 6A to 6L illustrate a detailed methodology of the steps provided by FIG. 5 for fabricating a fin bipolar transistor device. As will be described in detail below, the present techniques make use of a damascene gate process to construct collector/emitter regions that are self-aligned with the gate.

In step 510 (FIG. 6A), a silicon-on-insulator (SOI) substrate 640 having a silicon layer thereon is provided. Shallow trench isolation (STI) is used to define a silicon active area in the silicon-on-insulator (SOI) substrate. The substrate can include any suitable insulator material including, but not limited to, dielectric materials, such as silicon dioxide ($SiO_2$).

According to an exemplary embodiment of the present invention, substrate 640 has a nitride layer. i.e., nitride layer 644, thereon. A trench is etched in nitride layer 644 and silicon is deposited in the trench to form silicon layer 642. Excess silicon can be removed from silicon layer 642 using a planarization technique, such as chemical-mechanical planarization (CMP). According to an exemplary embodiment, silicon layer 642 is configured to have a thickness of between about 30 nanometers (nm) to about 40 nm, e.g., about 36 nm. Substrate 640 can also be referred to herein as a buried oxide (BOX) layer. Blanket deposition can be performed on the SOI substrate with blanket deposition doping agents prior to the Step 520. In such cases, the first concentration of the doping agents used for performing the blanket deposition on the SOI substrate is ten percent lower than a second concentration of doping agents used for doping the collector and emitter regions.

STI is generally employed with process technology in the nm feature size range. As will be described in detail below, the present techniques are suitable for producing fin bipolar transistor devices with contact line lengths down to below 30 nm, e.g., lengths down to about 22 nm.

Figure 6A:
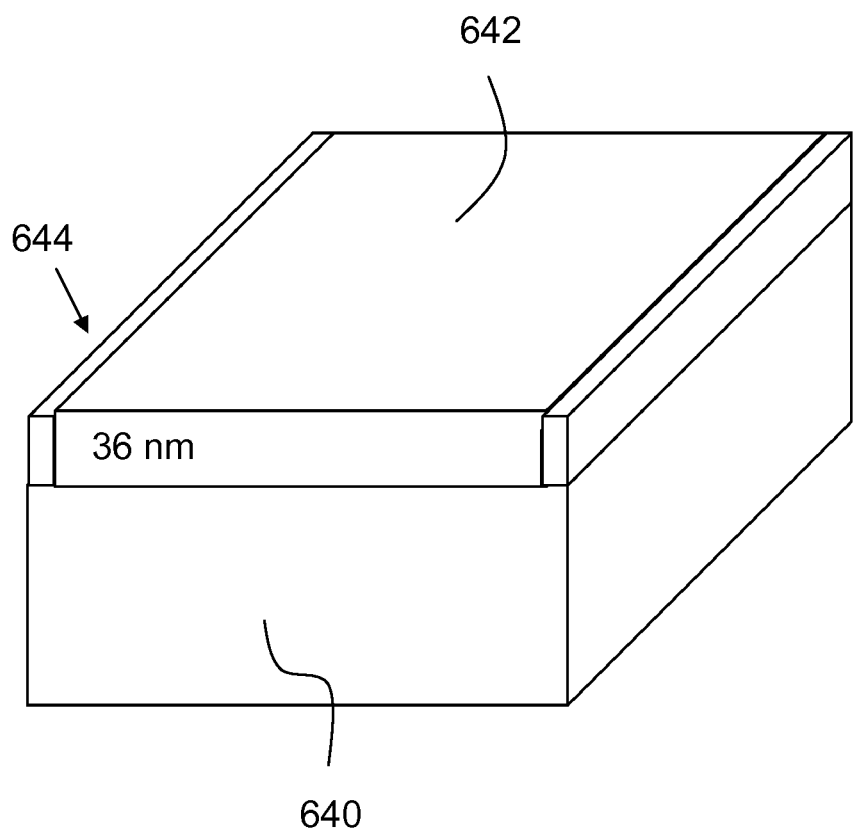
FIGS. 6A to 6L illustrate an exemplary methodology for fabricating a fin bipolar transistor device according to an embodiment of the present invention.
Figure 6B:
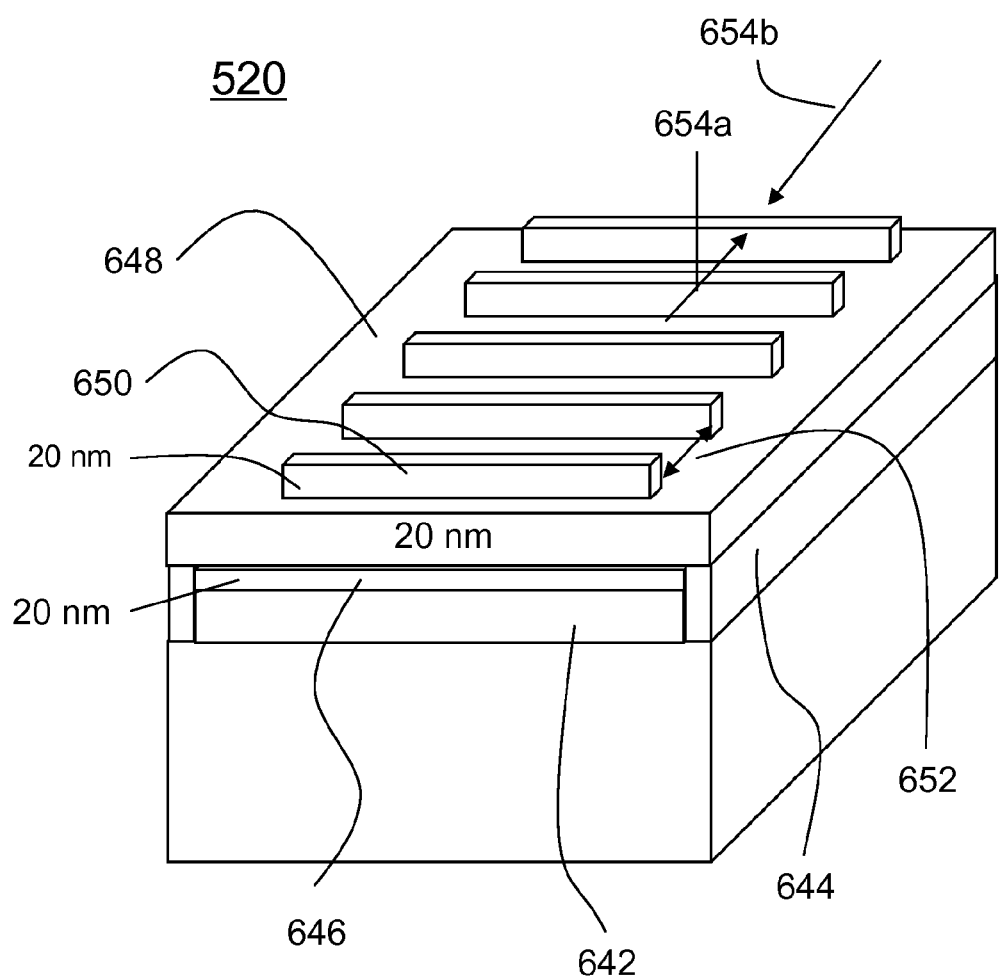
Figure 6C:
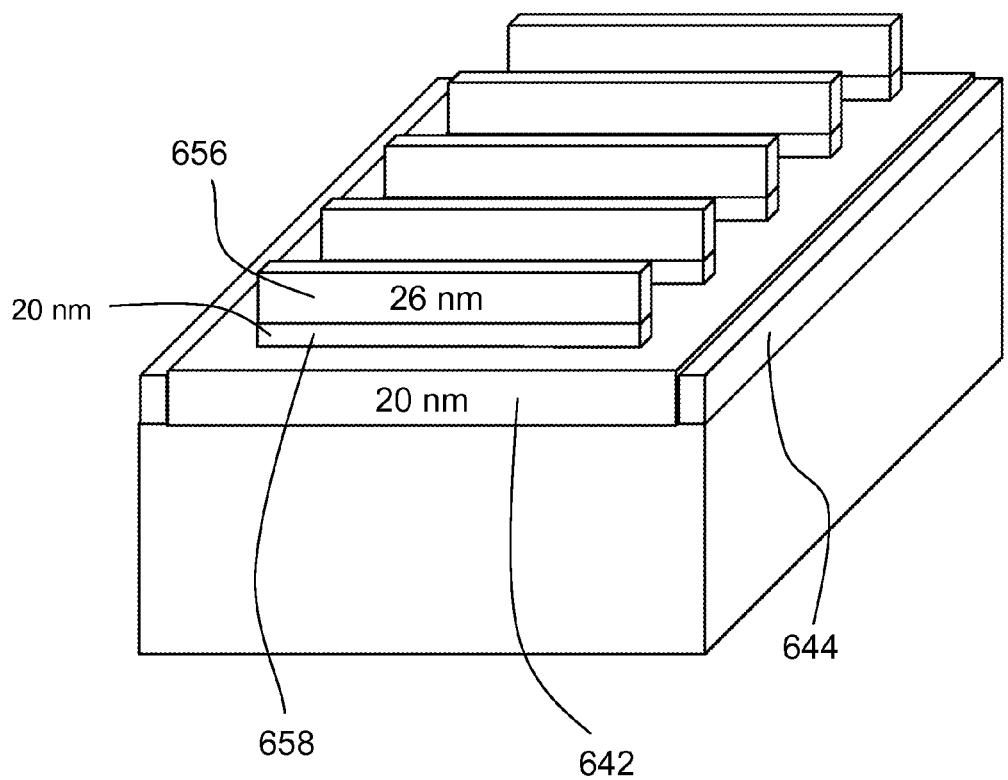
Figure 6D:
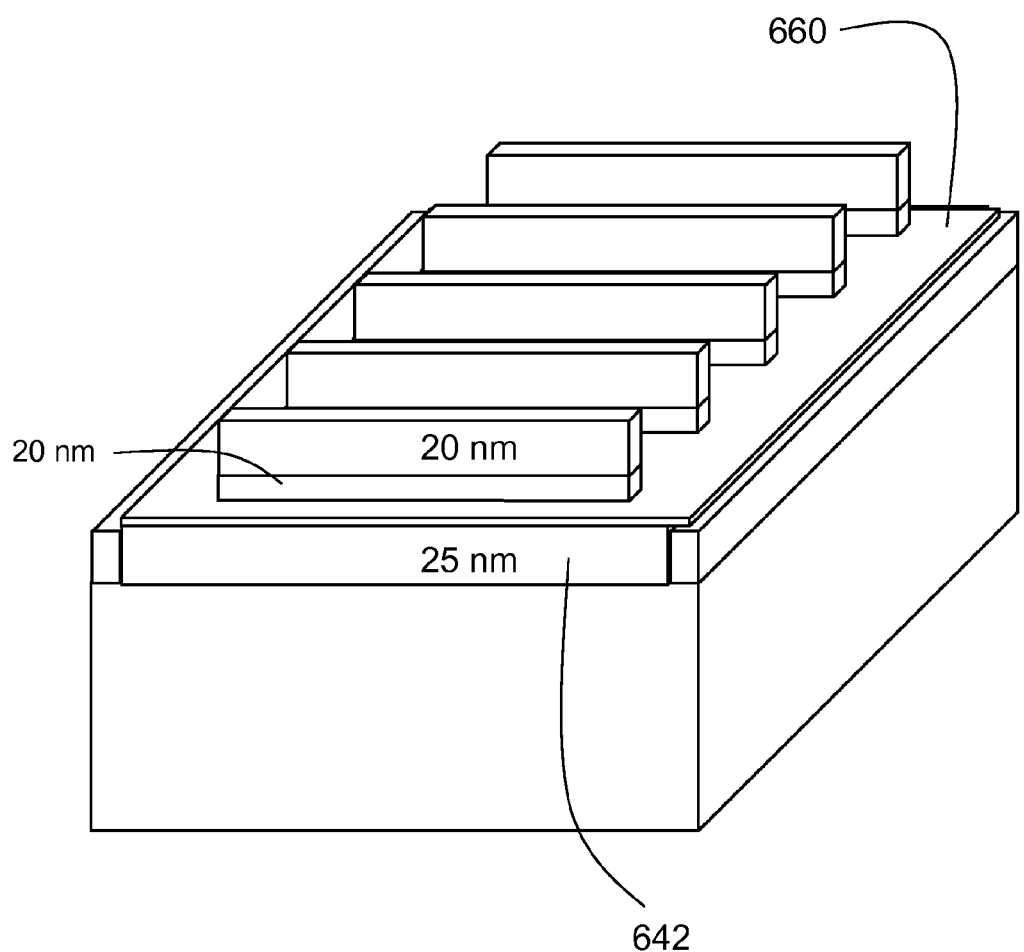

In FIGS. 6B to 6D, a fin hardmask on the silicon layer is patterned lithographically (Step 520). First, Oxide layer 646 is formed on silicon layer 642. According to an embodiment of the present invention, oxide layer 646 includes $SiO_2$, and is formed using thermal oxidation. Namely, an oxidizing agent, such as oxygen, is diffused into silicon layer 642 at a temperature of between about 700 degrees Celsius (° C.) and about 1,100° C. to grow oxide layer 646. As a result of the oxidation process, a portion of silicon layer 642 is consumed, reducing the thickness of silicon layer 642 to between about 20 nm and about 30 nm, e.g., to about 26 nm. Oxide layer 646 can have a thickness of between about 15 nm and about 25 nm, e.g., about 20 nm.

A second nitride layer, i.e., nitride layer 648, is deposited over nitride layer 644/oxide layer 646. According to an exemplary embodiment, nitride layer 648 is deposited using low-pressure chemical vapor deposition (LPCVD) to a thickness of between about 15 nm and about 20 nm, e.g., about 20 nm. Thus, nitride layer 648 can have a same thickness as oxide layer 646.

A resist film having a thickness of between about 15 nm and about 25 nm, e.g., about 20 nm, is deposited on nitride layer 648, masked and then patterned into fin resist stacks 650. According to an exemplary embodiment, reactive ion etching (RIE) will be used to form fin hardmasks, e.g., in nitride layer 648 (see description of step 106, below). Thus the resist film used to form fin resist stacks 650 should include a suitable resist material stack such as hydrogen silsesquioxane (HSQ) patterned using electron beam (e-beam) lithography and transferred to a carbon-based resist.

The positioning of fin resist stacks 650 will ultimately determine the positioning of the fins in the completed fin bipolar transistor device. According to an embodiment of the present invention, fin resist stacks 650 are configured to have a pitch. i.e., a distance between each adjacent fin resist stack, (as indicated by arrow 152) of between about 40 nm and about 200 nm, e.g., between about 40 nm and about 80 nm and a width $D_{fin}$ (as indicated by arrows 654a and 654b) of between about ten nm and about 40 nm, e.g., between about ten nm and about 20 nm. As such, the resulting fins will also have a pitch, i.e., a distance between adjacent fins, of between about 40 nm and about 200 nm, e.g., between about 40 nm and about 80 nm, and a width of between about ten nm and about 40 nm, e.g., between about ten nm and about 20 nm.

In FIG. 6C (Step 520), a hardmask open stage is then performed using a series of RIE steps in order to lithographically pattern the fin hardmask. According to an embodiment of the present invention, a nitride-selective RIE using fin resist stacks 650 (not shown) as a mask is first used to remove all but the portions of nitride layer 648 beneath fin resist stacks 650, forming fin hardmask layer 656. Oxide layer 646 acts as an etch stop for the nitride-selective RIE. The nitride-selective RIE can also at the same time etch nitride layer 644, with silicon layer 642 acting as an etch stop (as shown in step 106). As a result, nitride layer 644 will also then have a thickness of between about 20 nm and about 30 nm, e.g., about 26 nm.

Next, using fin hardmask layer 656 as a mask, an oxide-selective RIE is used to remove all but the portions of oxide layer 646 beneath fin hardmask layer 656, forming fin hardmask layer 658. Silicon layer 642 acts as an etch stop for the oxide-selective RIE. As with nitride layer 648 and oxide layer 646, fin hardmask layers 656 and 158, respectively, each have thicknesses of between about 15 nm and about 20 nm, e.g., about 20 nm.

Fin hardmask layers 656 and 158 form a dual fin hardmask structure. The use of a dual fin hardmask structure permits more precise and uniform fins to be formed in the silicon layer (see step 570, described below). Namely, with the dual fin hardmask structure, fin hardmask layer 656 (nitride layer) protects the integrity of fin hardmask layer 658 (oxide layer) during dummy contact line definition (see step 530, described below), and fin hardmask layer 658 (oxide layer) protects the fins during spacer (nitride-selective) etch. Maintaining good integrity of the fin hardmasks is important for minimizing variations in fin height and width. As fin bipolar transistor device's size becomes increasingly smaller, the effect of unwanted variations in fin dimensions, such as variations in fin thickness, becomes even more pronounced. Variations in fin dimensions are undesirable as they can affect the device threshold.

In FIG. 6D (Step 520), an oxide stopping layer, i.e. oxide layer 660, is formed on silicon layer 642. According to an exemplary embodiment, thermal oxidation is used to grow oxide layer 660 to a thickness of up to about four nm, e.g., up to about two nm. As described above, a portion of silicon layer 642 is consumed during thermal oxidation processes. Thus, the thickness of silicon layer 642 is reduced further to between about 25 nm and about 26 nm.

Figure 6E:
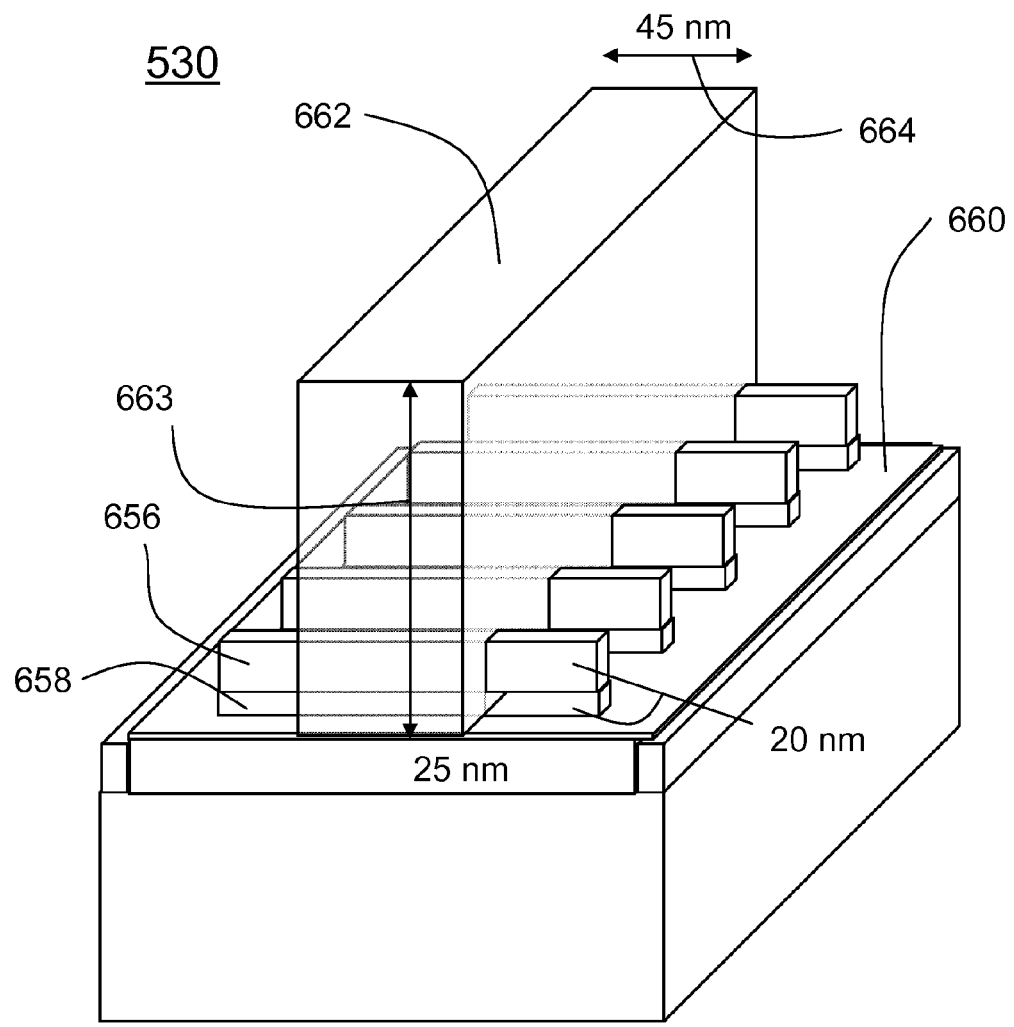

In FIG. 6E (Step 530), to begin the damascene gate process, dummy contact line 662 is placed over a central portion of patterned fin hardmask, where the step 530 exposes a collector/emitter region. The dummy contact line includes polycrystalline silicon (polysilicon). According to an exemplary embodiment of the present invention, dummy contact line 662 is formed by first depositing a polysilicon layer over oxide layer 660/fin hardmask layers 656 and 658 using LPCVD to a thickness of between about 100 nm and about 150 nm, e.g., about 140 nm. Since the thickness of the polysilicon layer will determine a height of the dummy contact line, CMP can be used after deposition to achieve the desired thickness/height. Resist is then deposited on the polysilicon layer, masked and patterned with the dummy contact line footprint. Polysilicon-selective RIE is then used to remove all but a central portion of the polysilicon layer located centrally over fin hardmask layers 656 and 158, which is dummy contact line 662. According to an exemplary embodiment, dummy contact line 662 has a height 663 of between about 100 nm and about 150 nm. e.g., about 140 nm, and a length 664 of between about 30 nm and about 50 nm, e.g., about 45 nm.

Figure 6F:
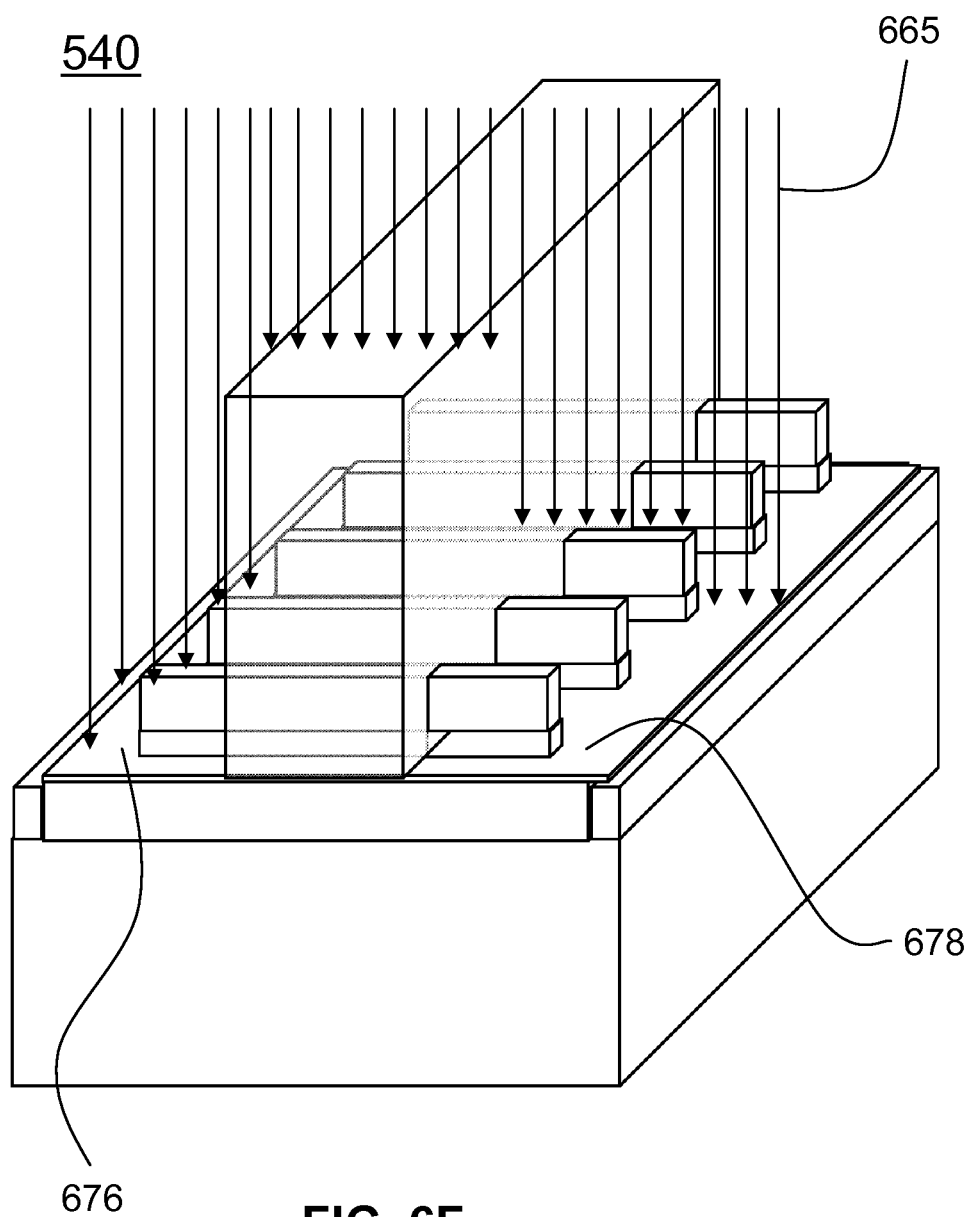

In FIG. 6F (Step 540), filler layers covering the collector/emitter regions 676 and 678 are doped. The arrows 665 in FIG. 2B signify the application of Step 540 to dope emitter and collector regions. The arrows 665 also show that in some embodiments, the doping operations are carried out with the doping applied substantially perpendicular to the surface of substrate 640. Doping the collect/emitter region is a technique well known to those of ordinary skill in the art, and is not described further herein.

Figure 6G:
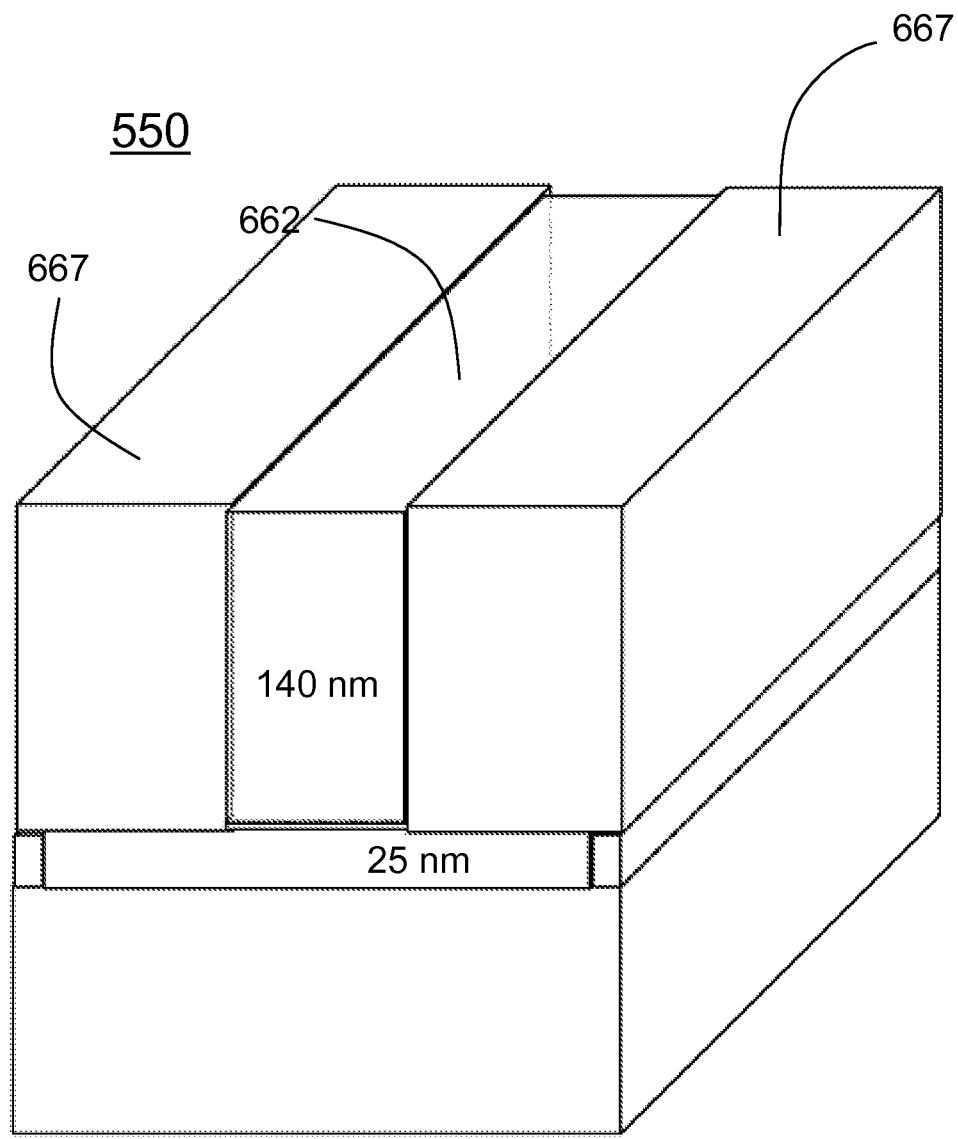

In FIG. 6G (Step 550), filler layer 667, is deposited around dummy contact line 662. Filler layer 667 can include any suitable filler material, including a dielectric, such as $SiO_2$. According to an exemplary embodiment, filler layer 667 is deposited around dummy contact line 662 using high-density plasma (HDP). CMP is then used to planarize the filler material, using the dummy contact line as an etch stop. Thus, filler layer 667 will have a thickness equivalent to the height of the dummy contact line, e.g., between about 100 nm and about 150 nm, e.g., about 140 nm.

Figure 6H:
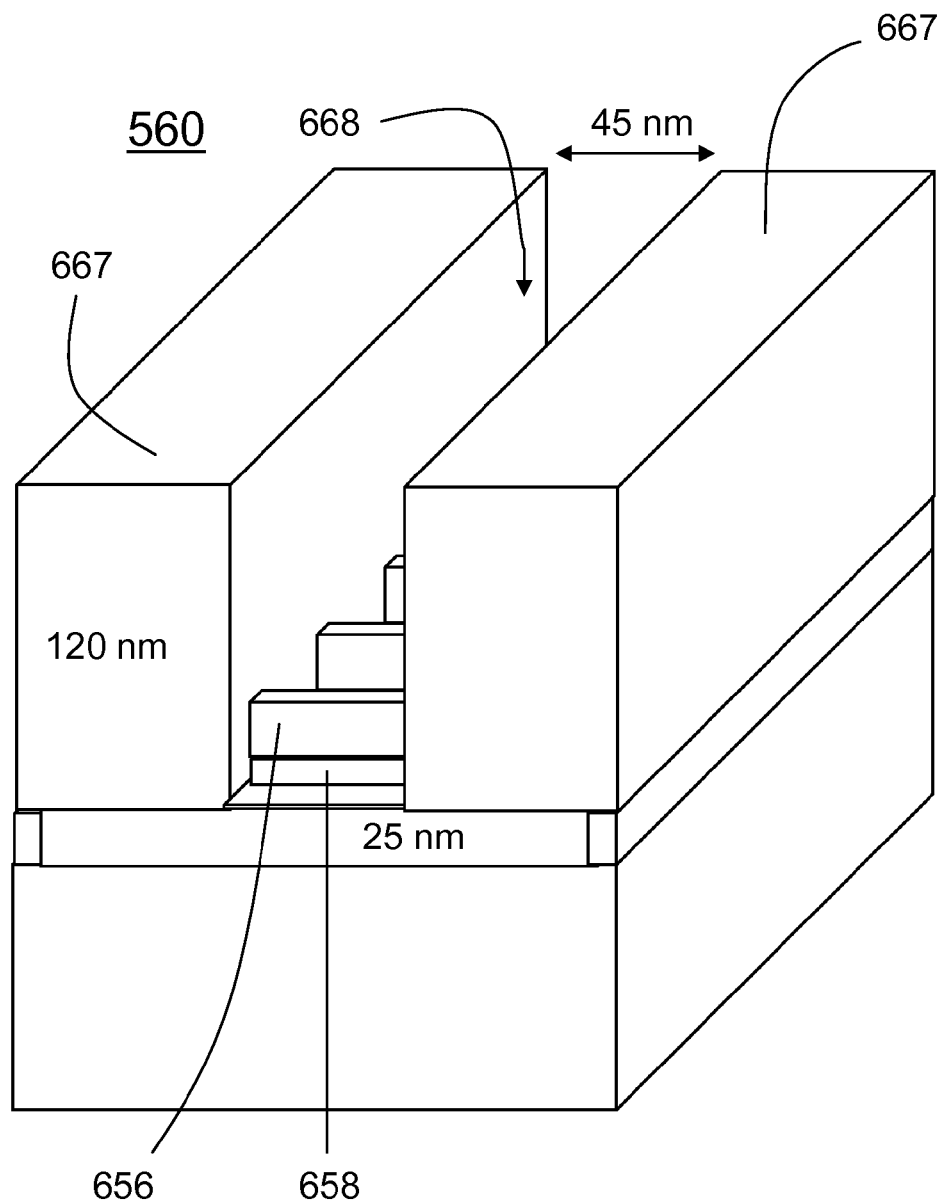

In FIG. 6H (Step 560), dummy contact line 662 is removed to reveal a trench 668 and the central portion of the patterned fin hardmask. Since trench 668 is a negative pattern of dummy contact line 662, trench 668 is also located centrally over fin hardmask layers 656 and 658. According to an exemplary embodiment of the present invention, trench 668 distinguishes a fin region from the collector and emitter regions of the fin bipolar transistor device.

Dummy contact line 662 can be removed using wet chemical etching or dry etching. According to an exemplary embodiment, a wet chemical etch is used to remove dummy contact line 662. The etching can also have an effect on the filler layer, removing a portion thereof. For example, after the etch process to remove dummy contact line 662, filler layer 667 can be reduced to a thickness of between about 115 nm and about 125 nm, e.g., about 120 nm.

The use of a dummy contact line is an important aspect of the present techniques. Dummy contact line 662 allows the fin hardmask layers to be placed prior to forming the filler layer, such that when the dummy contact line is removed, the fin hardmask layers revealed are already present within the trench. The fin hardmask layers are important for more precise and uniform fins to be formed in the fin region. Patterning well-defined fins with straight sidewalls inside the trench without the fin hardmask layers already present can be extremely difficult, if at all possible, due to the topography within the trench. As described above, minimizing variations in fin dimensions is desirable as variations can change the device threshold.

Figure 6I:
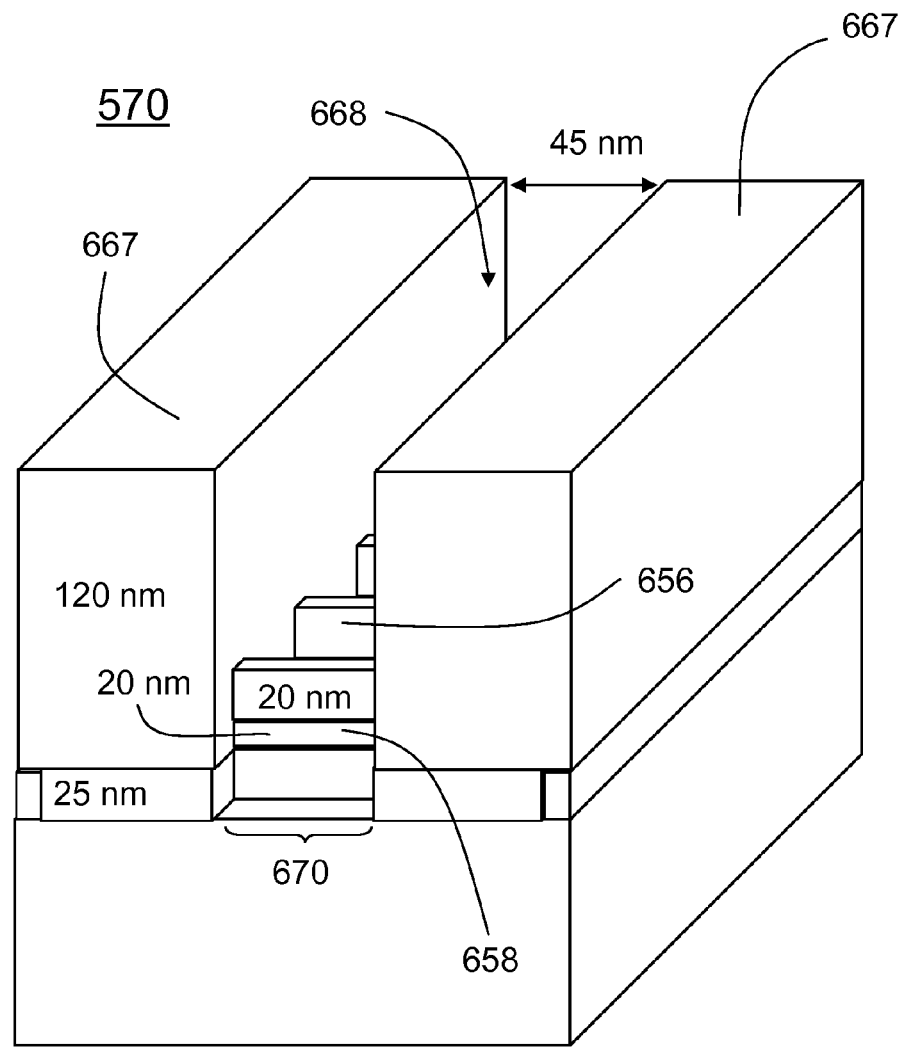

In FIG. 6I (Step 570), a plurality of fin-shaped base regions are formed in the silicon layer 642 by removing, within the trench, a portion of the silicon layer not covered by the central portion of the patterned fin hardmask after the step of removing the dummy contact line. A silicon-selective RIE is used to remove portions, i.e., portions 670, of silicon layer 642 in trench 668 not masked by the dual fin hardmask structure. Substrate 640 acts as an etch stop.

An advantage of the present teachings is that the fin-shaped base regions are etched only within trench 668, leaving the collector/emitter regions of the device intact below filler layer 667. Further, the collector/emitter regions produced in this manner will be self-aligned with trench 668 and thus with a device gate that will be formed in trench 668 (step 120, described below).

As described above, the present techniques can be used to form fins having a pitch, i.e., a distance between adjacent fin-shaped base regions, of between about 40 nm and about 200 nm, e.g., between about 40 nm and about 80 nm, and a width of between about ten nm and about 40 nm, e.g., between about ten nm and about 20 nm. Further, each of the fin-shaped base regions can have a height of between about 20 nm and about 100 nm, e.g., about 25 nm.

Figure 6J:
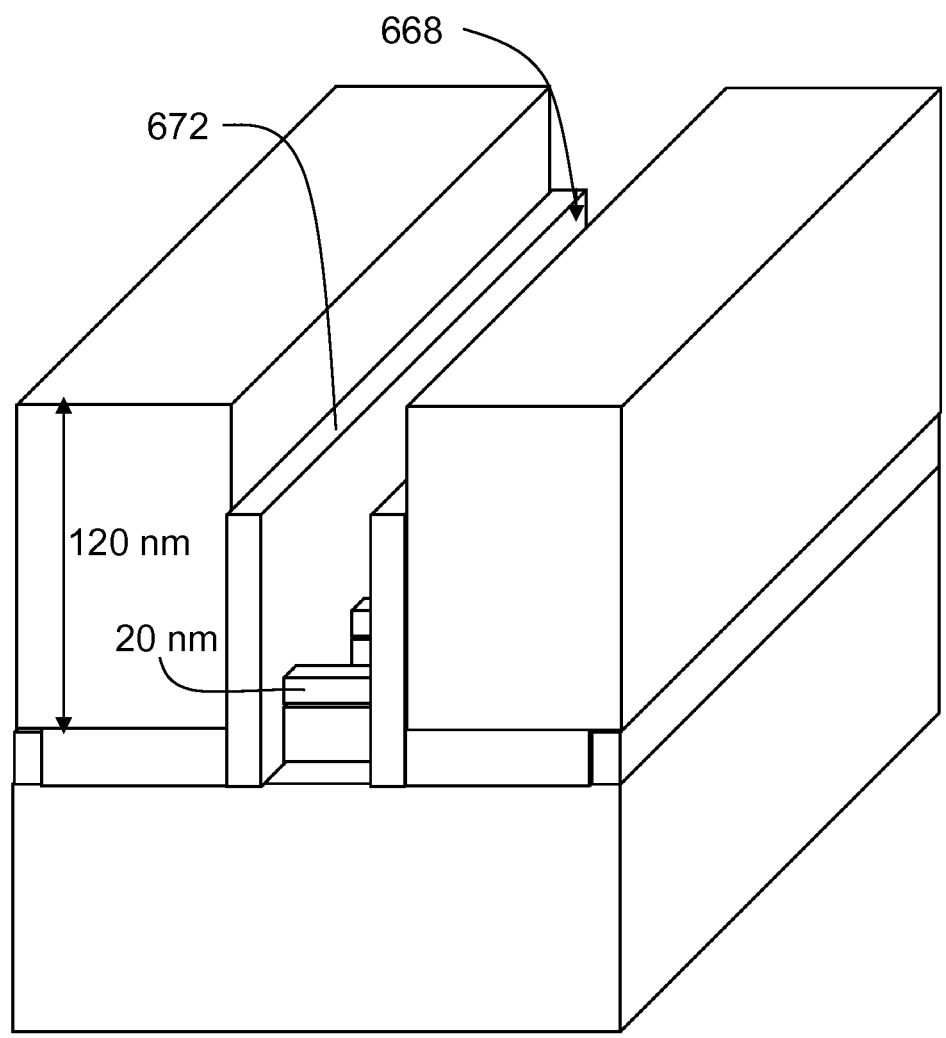

As an alternative embodiment of the present invention, spacers 672 can be formed in trench 668, as shown in FIG. 6J. This step is optional. Placing spacers between what will be the collector/emitter regions of the device and the device contact line (that will be formed in trench 668) will help to minimize parasitic capacitance in the completed device, but is not necessary for preventing contact line-to-collector/emitter shorting during raised collector/emitter (RSD) epitaxial growth or silicide, i.e., as in typical fin bipolar transistor flows. Spacers 672, which will be removed and replaced with an oxide spacer in the completed device, serve primarily at this stage to offset the gate a certain distance from the collector/emitter regions.

According to an exemplary embodiment, spacers 672 are formed by first depositing a nitride layer into trench 668. A resist film is then deposited on the nitride layer, masked and patterned with the spacer footprints. A nitride-selective RIE is then used to define spacers 672 in the nitride layer. A large timed overetch is needed to clear the sidewalls of the fin/dual fin hardmask structure, such that the spacers are present only along the sidewalls of the trench and not on the fins. The minimum pulldown of spacers 672 is thus the height of the fins and remaining fin hardmask layers. For example, the amount of overetch is between about 50 percent (%) and about 80% of the etch time required to remove the entire nitride layer. During this etch process, fin hardmask layer 656 is also removed. The spacers can have a length of between about five nm and about 25 nm. A maximum height of the spacers is equal to height of trench 668 less height of the spacer pulldown. A minimum height of the spacers is height of the collector/emitter regions, e.g., about 25 nm.

Figure 6K:
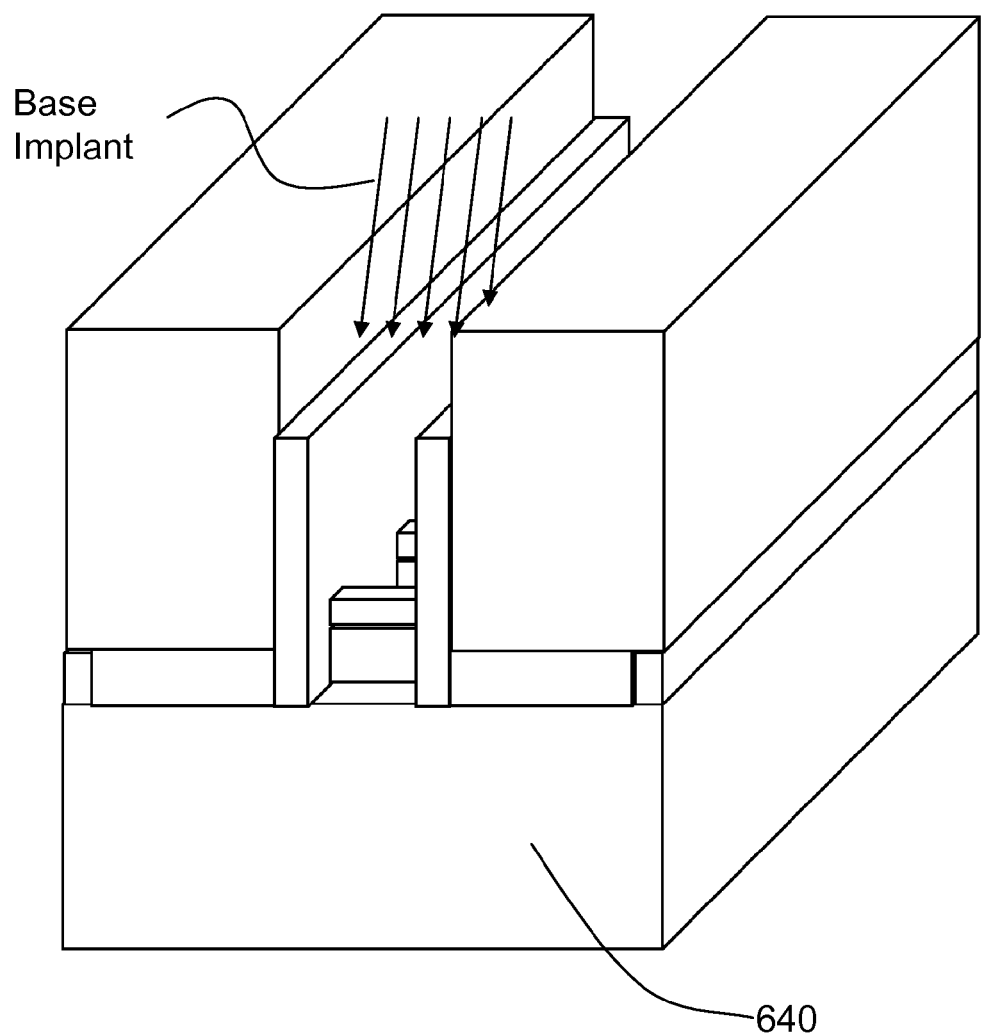

In FIG. 6K (Step 580), fin-shaped base regions are doped. The fin-shaped base regions can be doped by either: (i) solid source diffusion; or (ii) doping agent implant. Arrows are shown to illustrate the base doping step 580. In the solid-source diffusion technique, a dopant-containing material (the solid source) is deposited on the semiconductor fin to be doped. An elevated temperature treatment is then performed to allow the dopants in the dopant-containing material or solid-source to diffuse into the semiconductor fins. Examples of dopant-containing materials include boro-silicate glass (BSG), phospho-silicate glass (PSG), doped germanium, etc. Alternatively, the base implant doping can be applied at an angle to the perpendicular to fine tune the desired base-collector doping level gradient. According to an embodiment of the present invention, a doping agent can be a boron (p-type) or phosphorous (n-type). A doping agent, such as boron, phosphorous or arsenic is then implanted into substrate 640 at a tilt angle of up to about seven degrees.

Figure 6L:
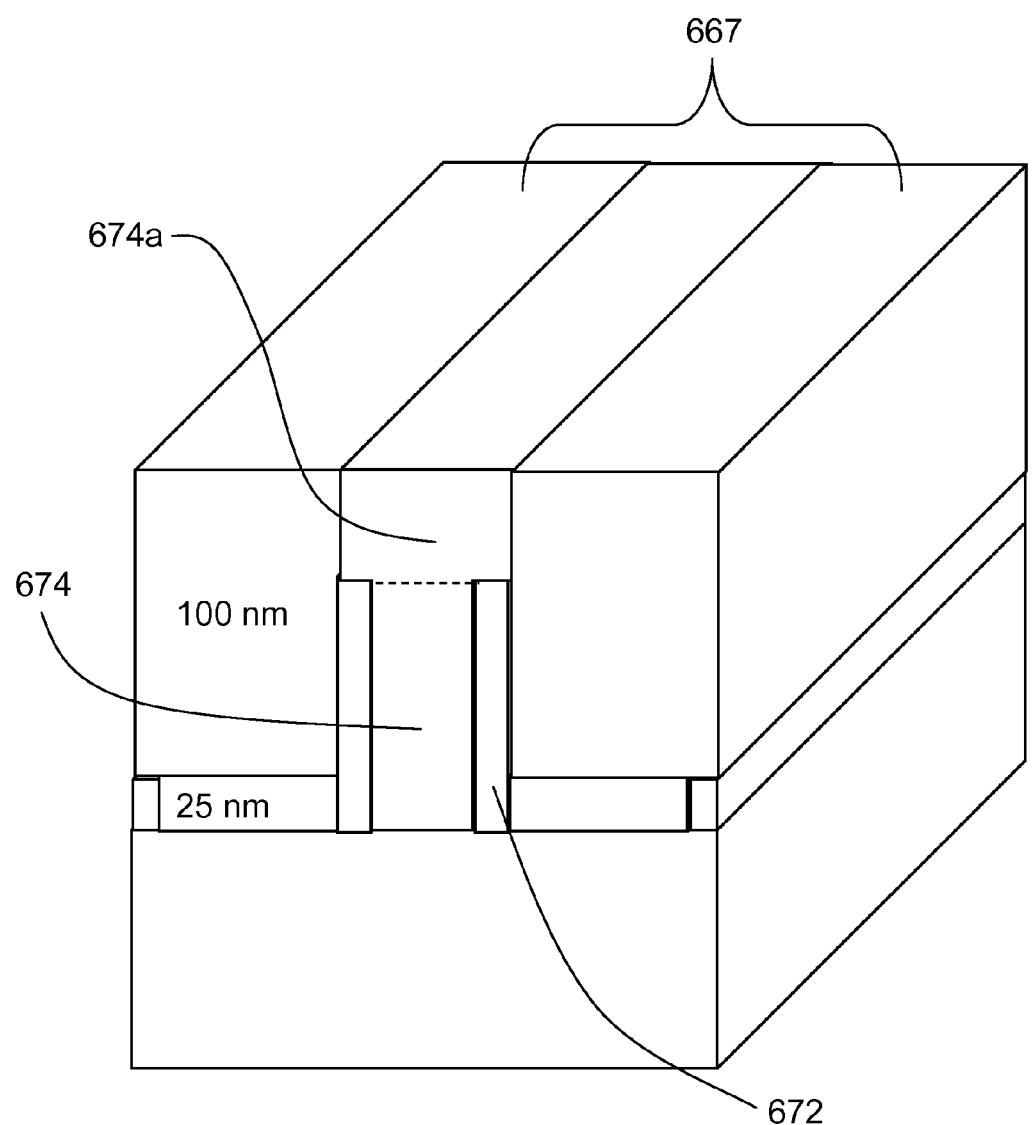

In FIG. 6L (Step 590), a contact line is formed by filling the trench with a contact line material over the fin-shaped base regions, where the collector and emitter regions are self-aligned with the contact line. In other words, a replacement gate, i.e., contact line 674, is formed over the fins by filling trench 668 with a gate material. Once the contact line material is filled into trench 668, CMP is used to planarize the contact line with filler layer 667 as an etch stop. Suitable gate materials include, but are not limited to, one or more of polysilicon, a deposited metal(s) and a hybrid stack of multiple materials such as metal polysilicon.

Optionally, any of the fin hardmask layers remaining over the fin-shaped base regions can be removed prior to filling the trench with the polysilicon material. Removing the fin hardmask layers, however, is not necessary. Further, according to an exemplary embodiment, prior to filling the trench with the contact line material, a thermal oxidation process can be used to grow a sacrificial oxide layer, e.g., $SiO_2$ or oxynitride, in trench 668, or a high-K dielectric material layer can be deposited into trench 668. These thermal oxide or high-k dielectric layers can serve as a gate dielectric between the gate and the fills.

As shown in FIG. 6L, contact line 674 can have a flared top section 674a, which is a result of the varied width of trench 668 by spacers 672. As will be described, for examples in conjunction with the description of FIG. 7, below, this flared top section of the gate stack can optionally be removed.

Figure 7:
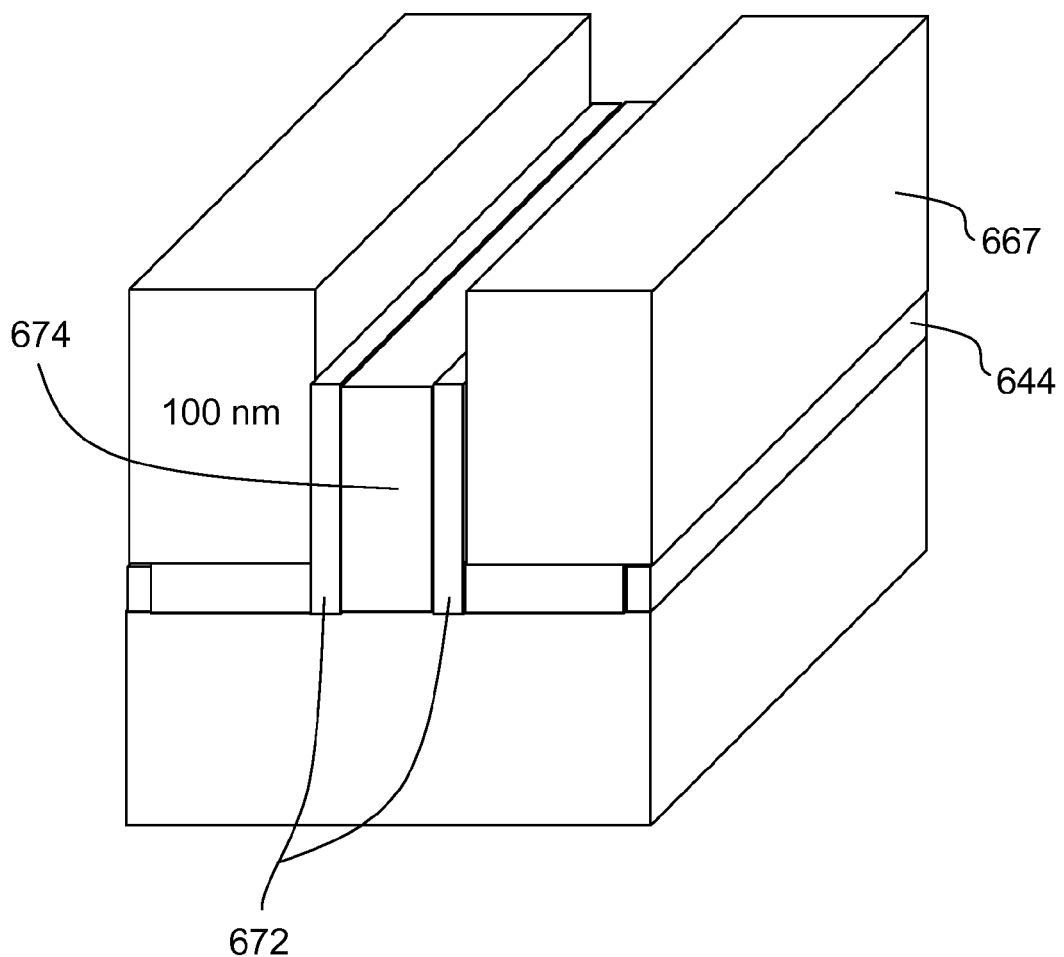
FIG. 7 illustrates a fin bipolar transistor device where flared top section is trimmed away from contact line according to an embodiment of the present invention.

In FIG. 7, flared top section 674a is trimmed away from contact line 674. As described above, this step is optional. For example, the remaining steps of the method shown in FIG. 5 can be performed without removing flared top section 674a from contact line 674. Removing the flared top section can provide a more compact layout. According to an exemplary embodiment of the present invention, flared top section 674a is trimmed away using CMP with spacers 672 as an etch stop.

Figure 8:
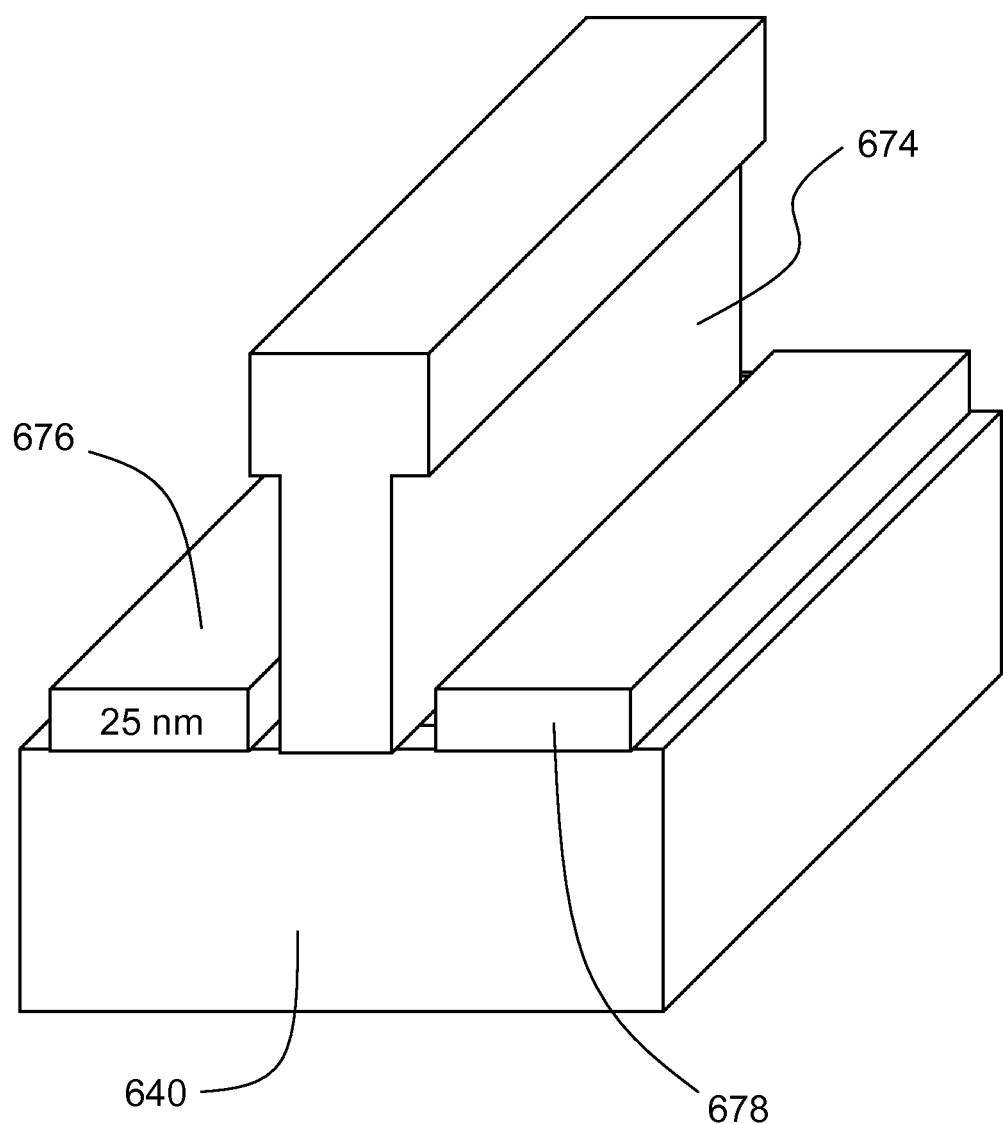
FIG. 8 illustrates a fin bipolar transistor device where the filler layers are removed according to an embodiment of the present invention.

In FIG. 8, the filler layers 667 can be removed according to another embodiment of the present invention. In this exemplary embodiment, flared top section 674a remains on contact line 674. In both FIG. 8 and FIG. 9, collector/emitter regions 676 and 678 are revealed after such removal.

Figure 9:
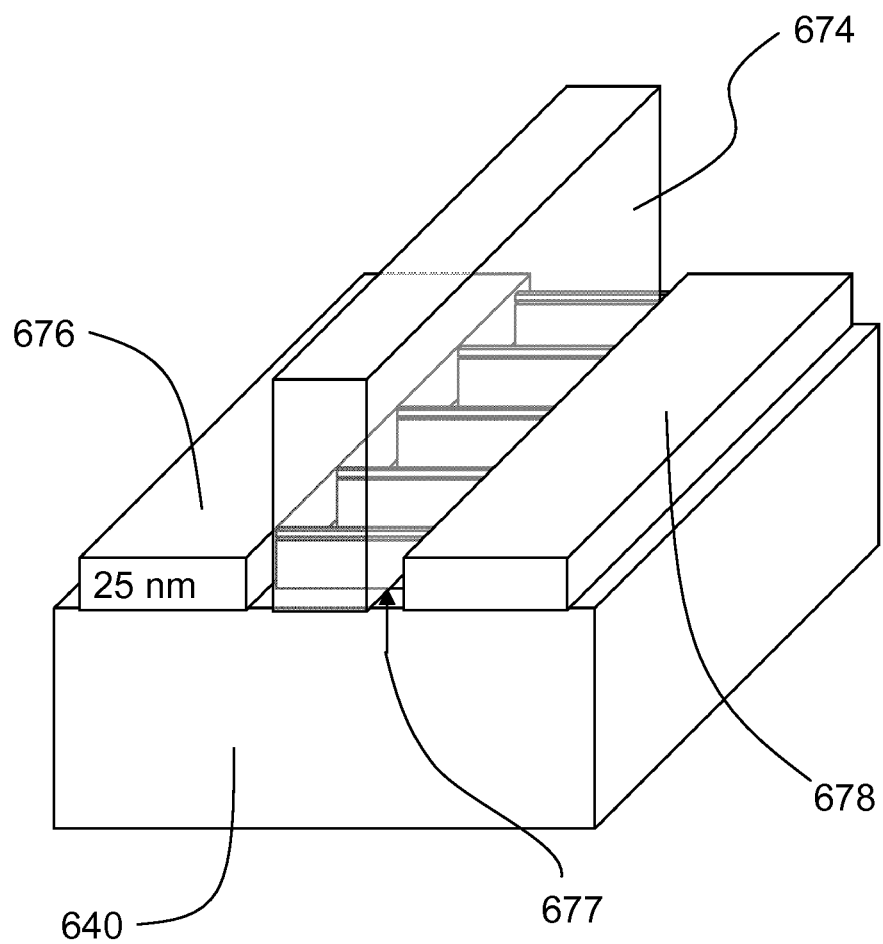
FIG. 9 illustrates a fin bipolar transistor device where the filler layers are removed and the flared top section is trimmed away according to an embodiment of the present invention.

In FIG. 9, after the filler layers are removed, the flared top section of the gate is trimmed away. Accordingly, an alternate doping scheme can be implemented. Following the removal of filler layer 667, spacers 672 are also removed, exposing fin extension regions 677. A doping agent, such as one or more of boron, phosphorous and arsenic is then implanted into substrate 640 at a tilt angle of between about 20 degrees and about 45 degrees.

Figure 10:
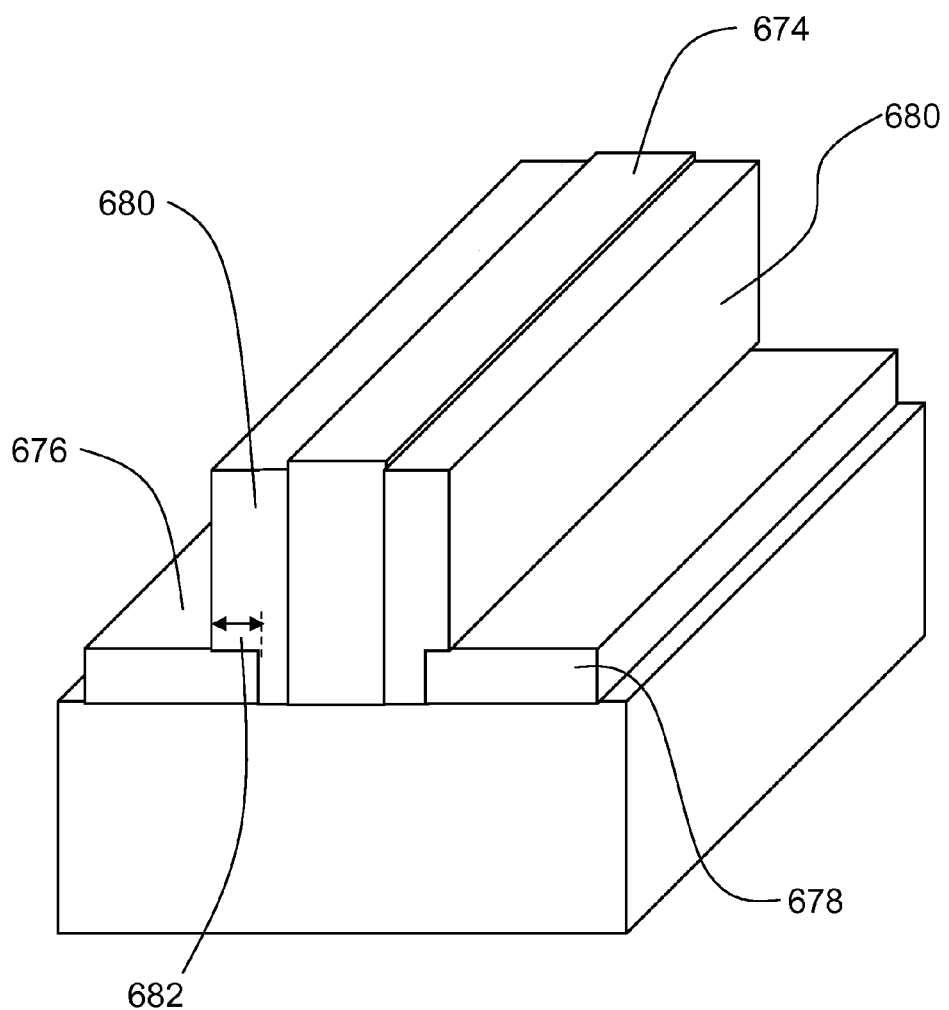
FIG. 10 illustrates a fin bipolar transistor device with device spacers according to an embodiment of the present invention.

In FIG. 10, replacement spacers, i.e., device spacers 680, are added. As highlighted above, the use of spacers is optional. Namely, according to an exemplary embodiment of the present invention, device spacers 680 are formed by first depositing an oxide ($SiO_2$) layer around contact line 674, including between collector/emitter regions 676 and 678 and contact line 674. A resist layer is deposited on the oxide layer, masked and patterned. Oxide selective RIE is then used to form device spacers 680. As shown in FIG. 9, device spacers 680 are preferably configured to extend a distance 682 of between about ten nm and about 40 nm over collector/emitter regions 676 and 678.

Also, in another embodiment of the present invention, collector/emitter regions 676 and 678 can be doped using top-down deep implants with a doping agent after the filler layers are removed instead of doping the collector/emitter regions prior to formation of the filler layers 667. As noted above, suitable doping agents include, but are not limited to boron and phosphorous.

Figure 11:
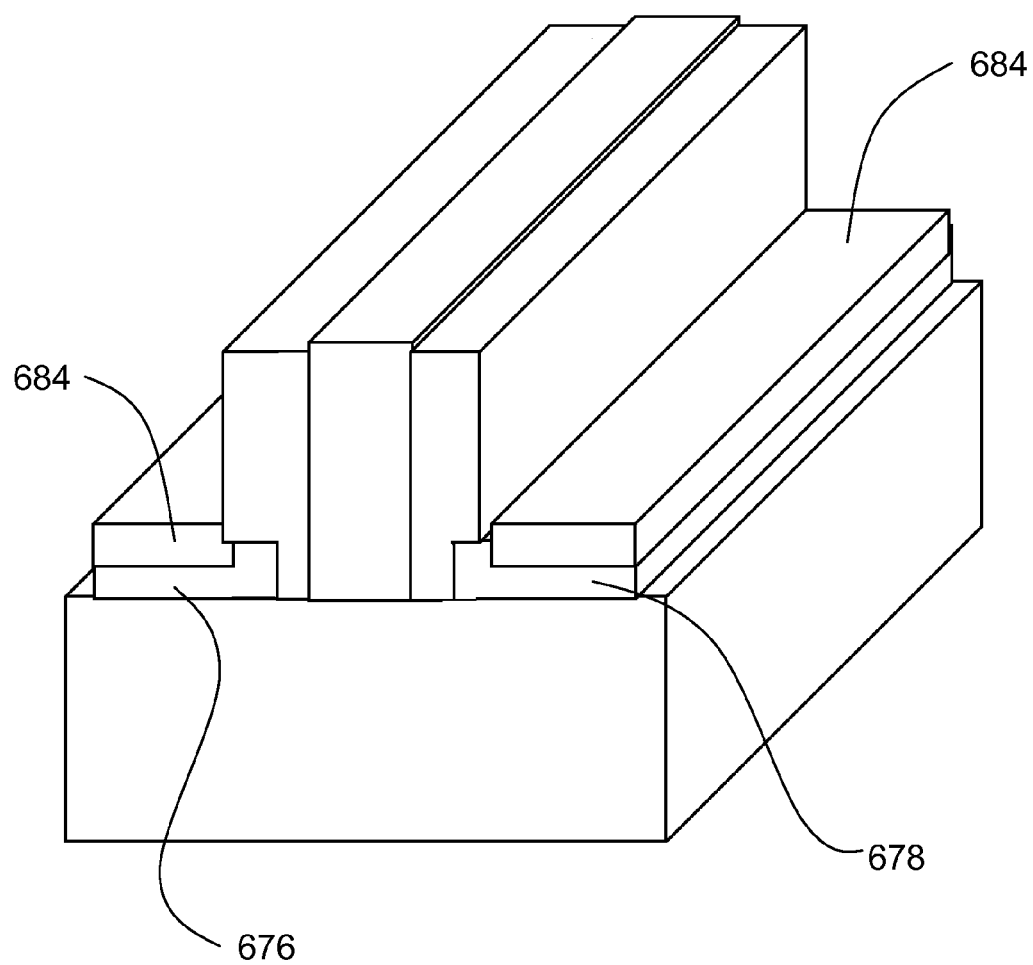
FIG. 11 illustrates a fin bipolar transistor device with silicide regions according to an embodiment of the present invention.

In FIG. 11, silicide regions 684 are formed on collector/emitter regions 676 and 678. Silicide regions 684 extend into the deep implants of collector/emitter regions 676 and 678. According to an exemplary embodiment, silicide regions 684 are formed by first depositing a non-transition metal, such as nickel-platinum (NiPt) on collector/emitter regions 676 and 678, and then annealing to form the silicide. After silicide formation, any standard middle-of-the-line complementary metal-oxide-semiconductor (CMOS) processes including middle-of-the-line dielectric deposition, contact stud patterning, metal patterning and metallization can be implemented.

It is to be understood that the sequence between the process steps shown in the accompanying figures and described herein can differ depending on the manner in which the present invention is used to create a final product such as a photovoltaic thin film structure. Given the teachings of the present invention, one of ordinary skill in the art will be able to contemplate these and similar implementations or configurations of the present invention.

It should also be understood that the above description is only representative of illustrative embodiments. For the convenience of the reader, the above description has focused on a representative sample of possible embodiments, a sample that is illustrative of the principles of the invention. The description has not attempted to exhaustively enumerate all possible variations. That alternative embodiments can not have been presented for a specific portion of the invention, or that further undescribed alternatives can be available for a portion, is not to be considered a disclaimer of those alternate embodiments. Other applications and embodiments can be implemented without departing from the spirit and scope of the present invention.

It is therefore intended, that the invention not be limited to the specifically described embodiments, because numerous permutations and combinations of the above and implementations involving non-inventive substitutions for the above can be created, but the invention is to be defined in accordance with the claims that follow. It can be appreciated that many of those undescribed embodiments are within the literal scope of the following claims, and that others are equivalent.

What is claimed is:

1. A bipolar transistor, comprising:
   a collector region;
   an emitter region;
   a plurality of fin-shaped base regions connecting said collector region and said emitter region; and
   a contact line placed over at least a portion of said fins, wherein said collector region and said emitter region are self aligned with said contact line.

2. The transistor according to claim 1, wherein said contact line comprises a conductive material selected from the group consisting of polycrystalline silicon, a metal, a metal/polycrystalline silicon hybrid, an epitaxially grown single crystalline silicon, and combinations thereof.

3. The transistor according to claim 1, further comprising:
   a first spacer layer between at least one of said plurality of fin-shaped based regions and said contact line; and
   a second spacer layer between said contact line, said emitter region, and said collector region.

4. The transistor according to claim 3, wherein said first spacer layer is thinner than said second spacer layer.

5. The transistor according to claim 1, wherein each of said plurality of fin-shaped base region has a height variation less than or equal to three nanometers.

6. The transistor according to claim 1, further comprising a silicide region placed on said collector region and said emitter region.

7. The transistor according to claim 1, wherein said contact line has a flared top section thereon.

8. The transistor according to claim 1, further comprising:
   filler layers on said collector region and said emitter region.

9. The transistor according to claim 1, further comprising a patterned fin hardmask on each of said plurality of fin-shaped base regions.

10. The transistor according to claim 9, wherein said patterned fin hardmask comprises a nitride fin hardmask layer and an oxide fin hardmask layer.

11. The transistor according to claim 9, wherein said fin hardmask is patterned with a resist material stack, electron beam lithography, and carbon-based resist.

12. The transistor according to claim 11, wherein said resist material stack comprises hydrogen silsesquioxane (HSQ).

13. The transistor according to claim 1, wherein said contact line is doped by solid source diffusion.

14. The transistor according to claim 1, wherein said contact line is doped by implanting said contact line with doping agents.

15. The transistor according to claim 1, wherein:
   a blanket deposition is performed on said SOI substrate with blanket deposition doping agents; and
   a first concentration of said doping agents used for performing said blanket deposition on said SOI substrate is ten percent lower than a second concentration of doping agents used for doping said collector and emitter regions.

16. The transistor according to claim 1, further comprising an oxide stopping layer having a thickness of up to about four nanometers on said SOI substrate.

17. The transistor according to claim 1, wherein said plurality of fin-shaped base regions are etched using silicon-selective reactive ion etching.

18. The transistor according to claim 17, wherein said contact line is formed by using a damascene process.

* * * * *